United States Patent
Wu et al.

(10) Patent No.: US 9,570,421 B2
(45) Date of Patent: Feb. 14, 2017

(54) STACKING OF MULTIPLE DIES FOR FORMING THREE DIMENSIONAL INTEGRATED CIRCUIT (3DIC) STRUCTURE

(71) Applicant: TAIWAN SEMICONDUCTOR MANUFACTURING COMPANY, LTD., Hsinchu (TW)

(72) Inventors: Chih-Wei Wu, Zhuangwei Township (TW); Ying-Ching Shih, Taipei (TW); Szu-Wei Lu, Hsinchu (TW); Jing-Cheng Lin, Hsinchu County (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 11 days.

(21) Appl. No.: 14/079,736

(22) Filed: Nov. 14, 2013

(65) Prior Publication Data

US 2015/0130072 A1   May 14, 2015

(51) Int. Cl.
*H01L 23/538* (2006.01)
*H01L 25/065* (2006.01)
(Continued)

(52) U.S. Cl.
CPC ......... *H01L 25/0657* (2013.01); *H01L 23/145* (2013.01); *H01L 23/147* (2013.01); *H01L 23/49816* (2013.01); *H01L 23/49827* (2013.01); *H01L 23/562* (2013.01); *H01L 24/81* (2013.01); *H01L 25/50* (2013.01); *H01L 23/3171* (2013.01); *H01L 23/3192* (2013.01);
(Continued)

(58) Field of Classification Search
CPC ... H01L 23/5384; H01L 24/82; H01L 25/0657

USPC .......................................................... 257/774
See application file for complete search history.

(56) References Cited

U.S. PATENT DOCUMENTS

| 5,633,535 A | * | 5/1997 | Chao | H01L 24/75 257/738 |
| 2003/0060035 A1 | * | 3/2003 | Kimura | H01L 23/50 438/626 |

(Continued)

FOREIGN PATENT DOCUMENTS

| TW | I231023 | 4/2005 |
| TW | 201117341 | 5/2011 |
| TW | I371845 | 9/2012 |

OTHER PUBLICATIONS

Office Action dated Sep. 21, 2015 from corresponding No. TW 103128046.

*Primary Examiner* — Kenneth Parker
*Assistant Examiner* — Warren H Kilpatrick
(74) *Attorney, Agent, or Firm* — Eschweiler & Associates, LLC

(57) ABSTRACT

The embodiments described provide methods and structures for forming support structures between dies and substrate(s) of a three dimensional integrated circuit (3DIC) structures. Each support structure adheres to surfaces of two neighboring dies or die and substrate to relieve stress caused by bowing of the die(s) and/or substrate on the bonding structures formed between the dies or die and substrate. The cost of the support structures is much lower than other processes, such as thermal compression bonding, to reduce the effect of bowing of dies and substrates on 3DIC formation. The support structures improves yield of 3DIC structures.

20 Claims, 13 Drawing Sheets

(51) Int. Cl.
  *H01L 25/00*   (2006.01)
  *H01L 23/14*   (2006.01)
  *H01L 23/498*  (2006.01)
  *H01L 23/31*       (2006.01)
  *H01L 23/00*       (2006.01)
  *H01L 23/48*       (2006.01)

(52) U.S. Cl.
  CPC ............. *H01L 23/481* (2013.01); *H01L 24/11* (2013.01); *H01L 24/13* (2013.01); *H01L 24/14* (2013.01); *H01L 24/16* (2013.01); *H01L 24/17* (2013.01); *H01L 24/32* (2013.01); *H01L 24/73* (2013.01); *H01L 24/92* (2013.01); *H01L 2224/0401* (2013.01); *H01L 2224/10135* (2013.01); *H01L 2224/11464* (2013.01); *H01L 2224/131* (2013.01); *H01L 2224/13012* (2013.01); *H01L 2224/13017* (2013.01); *H01L 2224/13022* (2013.01); *H01L 2224/13025* (2013.01); *H01L 2224/13082* (2013.01); *H01L 2224/13147* (2013.01); *H01L 2224/13155* (2013.01); *H01L 2224/13562* (2013.01); *H01L 2224/13582* (2013.01); *H01L 2224/13644* (2013.01); *H01L 2224/13664* (2013.01); *H01L 2224/1403* (2013.01); *H01L 2224/14181* (2013.01); *H01L 2224/16146* (2013.01); *H01L 2224/16235* (2013.01); *H01L 2224/17181* (2013.01); *H01L 2224/32145* (2013.01); *H01L 2224/32225* (2013.01); *H01L 2224/73204* (2013.01); *H01L 2224/81007* (2013.01); *H01L 2224/81139* (2013.01); *H01L 2224/81203* (2013.01); *H01L 2224/81815* (2013.01); *H01L 2224/92125* (2013.01); *H01L 2225/06513* (2013.01); *H01L 2225/06517* (2013.01); *H01L 2225/06541* (2013.01); *H01L 2225/06548* (2013.01); *H01L 2225/06572* (2013.01); *H01L 2924/10253* (2013.01); *H01L 2924/10271* (2013.01); *H01L 2924/1305* (2013.01); *H01L 2924/13091* (2013.01); *H01L 2924/1421* (2013.01); *H01L 2924/1431* (2013.01); *H01L 2924/1434* (2013.01); *H01L 2924/1437* (2013.01); *H01L 2924/157* (2013.01); *H01L 2924/1579* (2013.01); *H01L 2924/15311* (2013.01); *H01L 2924/15787* (2013.01); *H01L 2924/15788* (2013.01); *H01L 2924/3511* (2013.01); *H01L 2924/3512* (2013.01); *H01L 2924/37001* (2013.01)

(56) References Cited

U.S. PATENT DOCUMENTS

| | | | |
|---|---|---|---|
| 2009/0186447 A1* | 7/2009 | Mastromatteo | B81C 1/00269 438/107 |
| 2009/0200663 A1* | 8/2009 | Daubenspeck | H01L 23/49811 257/737 |
| 2011/0108973 A1* | 5/2011 | Hsieh | H01L 23/481 257/686 |
| 2012/0199981 A1* | 8/2012 | Jeong | H01L 23/481 257/774 |
| 2013/0000967 A1* | 1/2013 | Lee | H01L 24/11 174/261 |
| 2013/0256895 A1* | 10/2013 | Su | H01L 24/11 257/773 |

* cited by examiner

STACKING OF MULTIPLE DIES FOR FORMING THREE DIMENSIONAL INTEGRATED CIRCUIT (3DIC) STRUCTURE

BACKGROUND

Integrated circuits have experienced continuous rapid growth due to constant improvements in an integration density of various electronic components (i.e., transistors, diodes, resistors, capacitors, etc.). For the most part, this improvement in integration density has come from repeated reduction in minimum feature size, allowing more components to be integrated into a given chip area.

The volume occupied by the integrated components is near the surface of the semiconductor wafer. Although dramatic improvements in lithography have resulted in considerable improvement in two-dimensional (2D) integrated circuit formation, there are physical limitations to an achievable density in two dimensions. One of these limitations is the minimum size needed to make the integrated components. Further, when more devices are put into one chip, more complex designs are required. An additional limitation comes from the significant gains in the number and length of interconnections between devices as the number of devices increases. When the number and length of interconnections increase, both circuit RC delay and power consumption increase.

Three-dimensional integrated circuits (3DIC) were thus proposed, wherein dies are stacked, with wire-bonding, flip-chip bonding, and/or through-silicon vias (TSV) being used to stack the dies together and to connect the dies to package substrates.

BRIEF DESCRIPTION OF THE DRAWINGS

The present disclosure will be readily understood by the following detailed description in conjunction with the accompanying drawings, and like reference numerals designate like structural elements.

DETAILED DESCRIPTION

Figure 1:
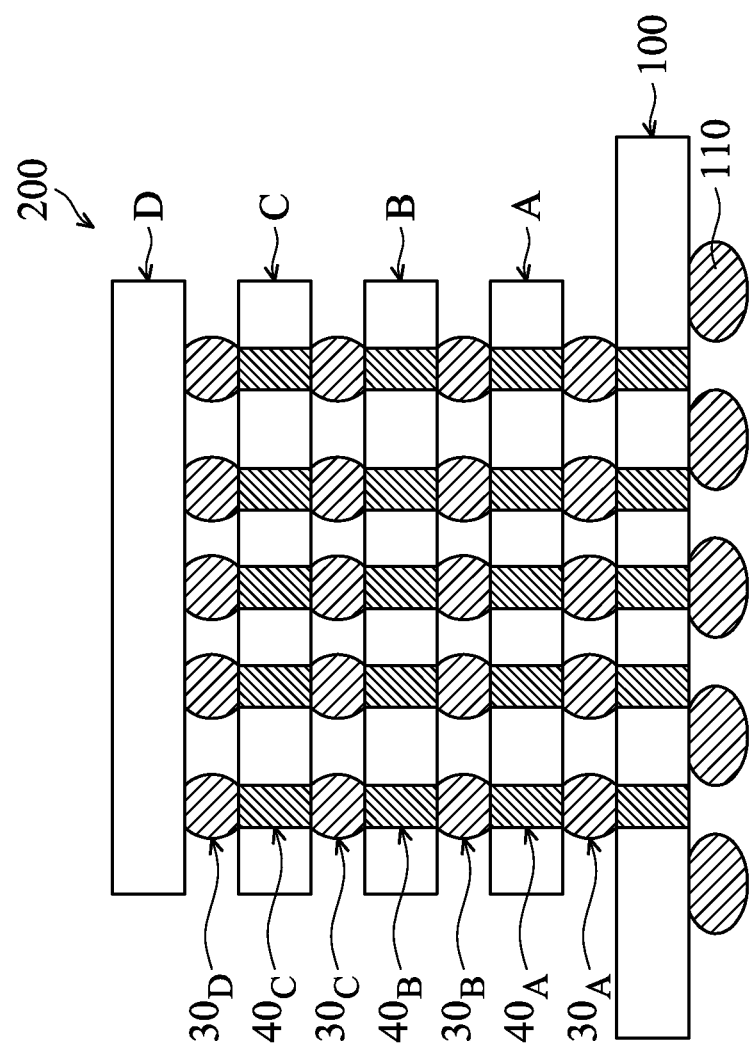
FIG. 1 is a cross-sectional view of a three-dimensional integrated circuit (3DIC) structure, in accordance with some embodiments.

It is to be understood that the following disclosure provides many different embodiments, or examples, for implementing different features. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a cross-sectional view of a three-dimensional integrated circuit (3DIC) structure 200, in accordance with some embodiments. 3DIC structure 200 includes semiconductor dies A, B, C, and D stacked on top of one another on a substrate 100. Each of the semiconductor dies A, B, and C has one or more through silicon vias (TSVs) $40_A$, $40_B$, or $40_C$, for inter-die communications and heat dissipation. The TSVs $40_A$, $40_B$, and $40_C$ are connected to other TSVs or substrate 100 through bonding structures $30_A$ $30_B$, $30_C$, and $30_D$ in semiconductor dies A, B, C, and D, respectively, which could be electrically connected to integrated circuits (not shown) in each die. In some embodiments, the bonding structures $30_A$ $30_B$, $30_C$, and $30_D$ include various types of metal, such as solder, gold, copper, etc. Substrate 100 also includes external connectors 110. The width of substrate 100 is wider than the widths of each of semiconductor dies A, B, C, and D.

Each semiconductor die includes a semiconductor substrate as employed in a semiconductor integrated circuit fabrication, and integrated circuits may be formed therein and/or thereupon. The semiconductor substrate refers to any construction comprising semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. The semiconductor substrate may further comprise a plurality of isolation features (not shown), such as shallow trench isolation (STI) features or local oxidation of silicon (LOCOS) features. The isolation features may define and isolate the various microelectronic elements. Examples of the various microelectronic elements that may be formed in the semiconductor substrate include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors;

diodes; capacitors; inductors; fuses; and other suitable elements. Various processes are performed to form the various microelectronic elements including deposition, etching, implantation, photolithography, annealing, and/or other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices. In some embodiments, each semiconductor die also includes passive devices such as resistors, capacitors, inductors and the like.

Each semiconductor die may include interconnect structures or redistribution layer(s) (RDL) (not shown) to enable electrical connection between interconnect in each die and external connectors. RDLs are interconnect structures near a surface of die packages or on packaging structures to facilitate electrical connections. Dies, such as dies A, B, and C, between top die D and substrate 100 may further include through substrate vias (TSVs) and may be interposers.

Substrate 100 may be made of a semiconductor wafer, or a portion of wafer. In some embodiments, substrate 100 includes silicon, gallium arsenide, silicon on insulator ("SOI") or other similar materials. In some embodiments, substrate 100 also includes passive devices such as resistors, capacitors, inductors and the like, or active devices such as transistors. In some embodiments, substrate 100 includes additional integrated circuits. In addition, the substrate 100 may be made of other materials. For example, in some embodiments, substrate 100 is a multiple-layer circuit board. In some embodiments, substrate 100 also includes bismaleimide triazine (BT) resin, FR-4 (a composite material composed of woven fiberglass cloth with an epoxy resin binder that is flame resistant), ceramic, glass, plastic, tape, film, or other supporting materials that may carry the conductive pads or lands needed to receive conductive terminals.

To form the 3DIC structure 200 in FIG. 1, dies A, B, C, and D are stacked over substrate 100 and then undergo a reflow process to form the bonding structures $30_A$ $30_B$, $30_C$, and $30_D$. In some embodiments, some or all of semiconductor dies A, B, C, and D bow before or after the reflow process used to form bonding structures $30_A$ $30_B$, $30_C$, and $30_D$. The bowing of a die is caused by a mis-match of coefficients of thermal expansion (CTE) and stress of various layers in the die. During the formation of devices and structures of dies on a substrate, films with different CTE and stress are formed on the substrate. The substrate also undergoes different thermal processes during the formation of the devices and structure. After the formation of devices and structures are completed, dies formed on the substrate are separated into individual pieces, such as semiconductor dies A, B, C, and D. The separated and individual dies could bow due to mis-match of coefficients of thermal expansion (CTE) and stress of various layers in the die.

Figure 2A:
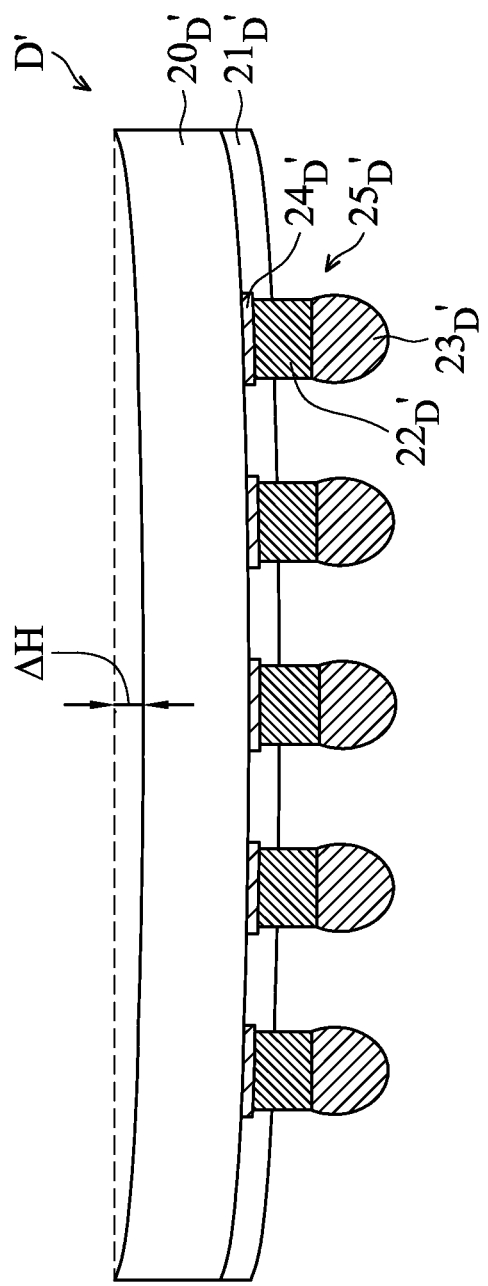
FIG. 2A is a cross-sectional view of a die, in accordance with some embodiments.

FIG. 2A is a cross-sectional view of a die D', in accordance with some embodiments. Die D' is similar to semiconductor die D and includes a substrate $20_D$' with devices (not shown) and interconnect structures (not shown) formed therein. Die D' has connecting structures $25_D$'. Each connecting structure $25_D$' includes a copper post $22_D$' and a solder layer $23_D$' formed over the copper post $22_D$'. The copper post $22_D$' comes in contact with a metal pad $24_D$', which is connected to interconnect structures (not shown) and devices (not shown) in die D'. In some embodiments, an under bump metallurgy (UBM) layer (not shown) is between copper post $22_D$' and the metal pad $24_D$'. The structure of a connecting structure $25_D$' described above is merely an example. Other connecting structures may also be used.

A passivation structure $21_D$' is formed over substrate $20_D$' to protect substrate $20_D$'. The passivation structure $21_D$' may include one or more passivation layers. The passivation layer(s) is made of silicon nitride, silicon oxynitride, polymers, or combinations thereof, in some embodiments. Die D' may or may not have has TSVs. In some embodiments where die D' is a top die, die D' does not have TSVs. In some embodiments where die D' is a die between a top die and a substrate, die D' has TSVs.

Figure 2B:
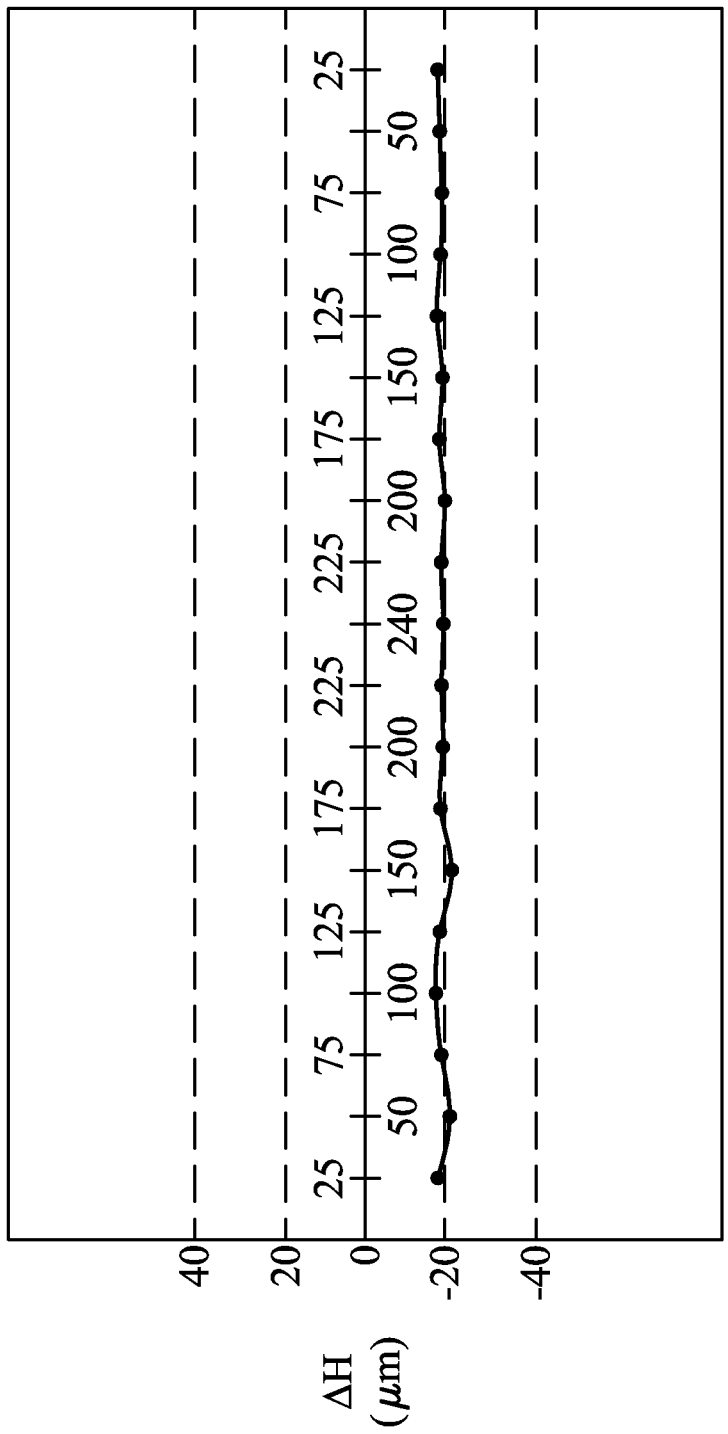
FIG. 2B is a diagram the warpage of a die with temperatures of a thermal cycling of the die of FIG. 2A, in accordance with some embodiments.

As shown in FIG. 2A, die D' bows upward at the edges. As a result, die D' has a crescent cross-sectional shape. For a lead-free bump scheme, the reflow process for forming bonding structures is performed at a peak temperature in a range from about 230° C. to about 250° C., in accordance with some embodiments. To understand the effect of a thermal process, such as reflow, on the planarity (or flatness) of dies, in a non-limiting example, die D' undergoes a thermal cycling with temperature rising from room temperature (25° C.) to 240° C. and back to room temperature (25° C.). FIG. 2B is a diagram of the warpage of die D' with temperatures of the thermal cycling, in accordance with some embodiments. The die warpage AH is defined as a difference of heights between a top surface at a center of die and a top surface at an edge of die. For example, a warpage of −20 μm for a die means the edges of the die are higher than the center of the die by 20 μm. FIG. 2B indicates that the die warpages for die D' stay consistently at about −20 μm during the thermal cycling. The data in FIG. 2B indicate that die D' bows upward at the edges under various temperatures of the thermal cycling. The shape of die D' with edges higher than center of die resembles a crescent shape, as in FIG. 2A.

Figure 3A:
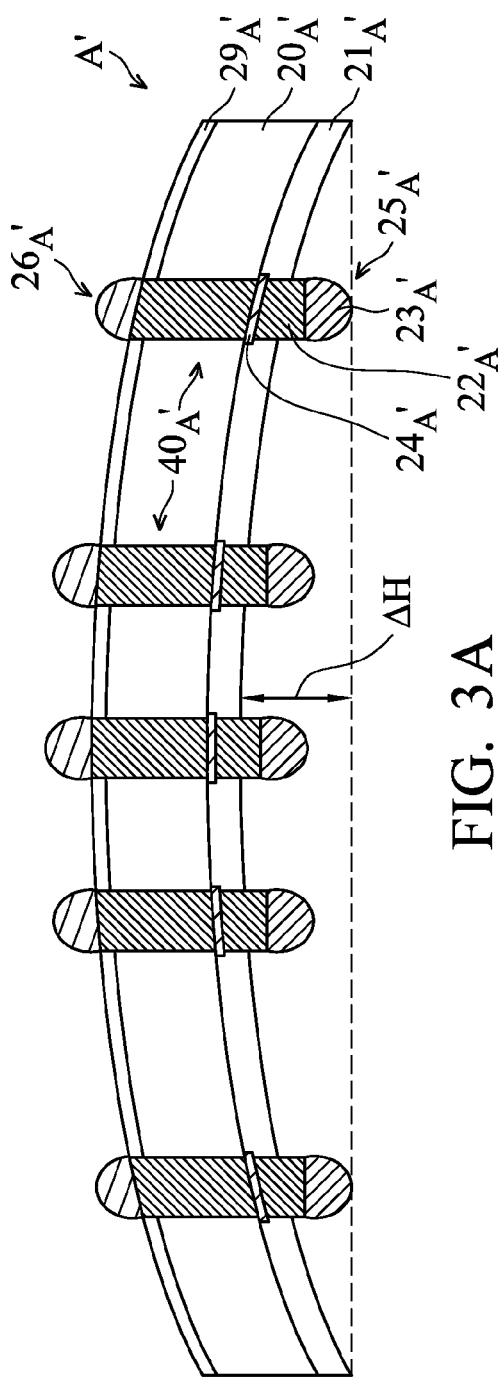
FIG. 3A is a cross-sectional view of a die, in accordance with some embodiments.

FIG. 3A is a cross-sectional view of die A', in accordance with some embodiments. Die A' is similar to die A (FIG. 1), and includes a substrate $20_A$' with devices (not shown) and interconnect structures (not shown) formed therein. Die A' also has TSVs $40_A$' and also connecting structures $25_A$'. Each connecting structure $25_A$' includes a copper post $22_A$' and a solder layer $23_A$' formed over the copper post $22_A$'. The copper post $22_A$' comes in contact with a metal pad $24_A$', which is connected to TSV $40_A$'. In some embodiments, an under bump metallurgy (UBM) layer (not shown) is between copper post $22_A$' and metal pad $24_A$'. A passivation structure $21_A$' is formed over substrate $20_A$' to protect substrate $20_A$'. The passivation structure $21_A$' is similar to passivation structure $21_D$' and may include one or more passivation layers. The other end of TSV $40_A$' is connected to another connecting structure $26_A$'. In some embodiments, a passivation structure $29_A$' is formed over a backside of substrate $20_A$' opposite passivation layer $21_A$', as in FIG. 3A. The passivation structure $29_A$' may include one or more passivation layers. The passivation layer(s) is made of silicon nitride, silicon oxynitride, polymers, or combinations thereof, in some embodiments.

Figure 3B:
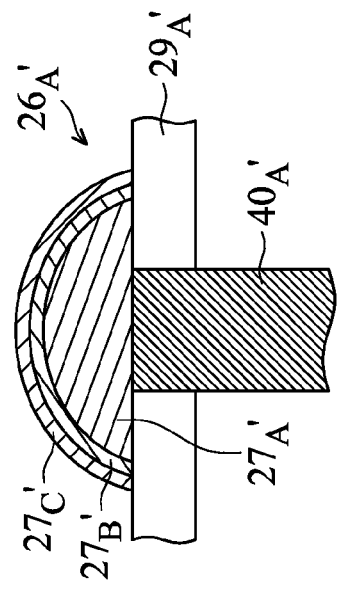
FIG. 3B is a cross-sectional view of a connecting structure on a die of FIG. 3A, in accordance with some embodiments.

In some embodiments, each connecting structure $26_A$' includes a nickel (Ni) layer $27_A$', a palladium (Pd) layer $27_B$', and a gold (Au) layer $27_C$', as in FIG. 3B. In some embodiments, the connecting structure $26_A$' are made of electroless Ni, electroless Pd, and immersion Au (or electroless-Ni/electroless-Pd/immersion-Au, or ENEPIG). Connecting structures using ENEPIG layers are used for bonding and are lead-free (Pb-free).

Figure 3C:
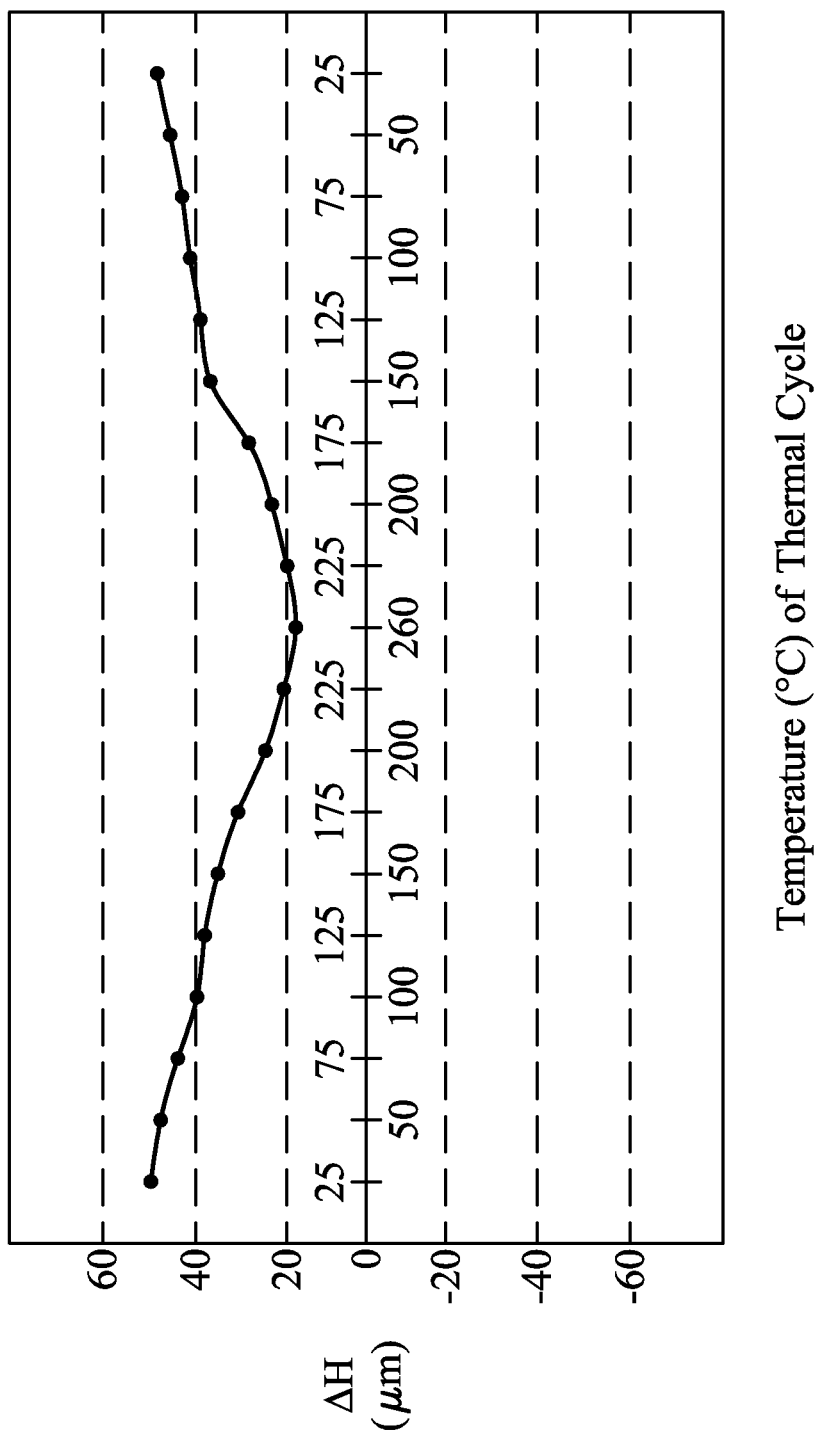
FIG. 3C is a diagram the warpage of a die with temperatures of a thermal cycling of the die of FIG. 3A, in accordance with some embodiments.

To understand the effect of a thermal process on the planarity (or flatness) of dies, in a non-liming example, die A' undergoes a thermal cycling with temperature rising from room temperature (25° C.) to 260° C. and back to room temperature (25° C.). FIG. 3C is a diagram of the warpage (ΔH) of die A' with temperatures of the thermal cycling, in accordance with some embodiments. FIG. 3C indicates that the die warpage stay consistently at about 50 μm at room temperature and decrease to about 17 μm at 260° C. The warpage recovers to about 50 μm when the temperature cycles back to room temperature. The data in FIG. 3C indicate that die A' bows downward at the edges during the various temperatures of thermal cycling. The shape of die A' with edges lower than a center of the die resembles a downward facing crescent shape.

Figure 4:
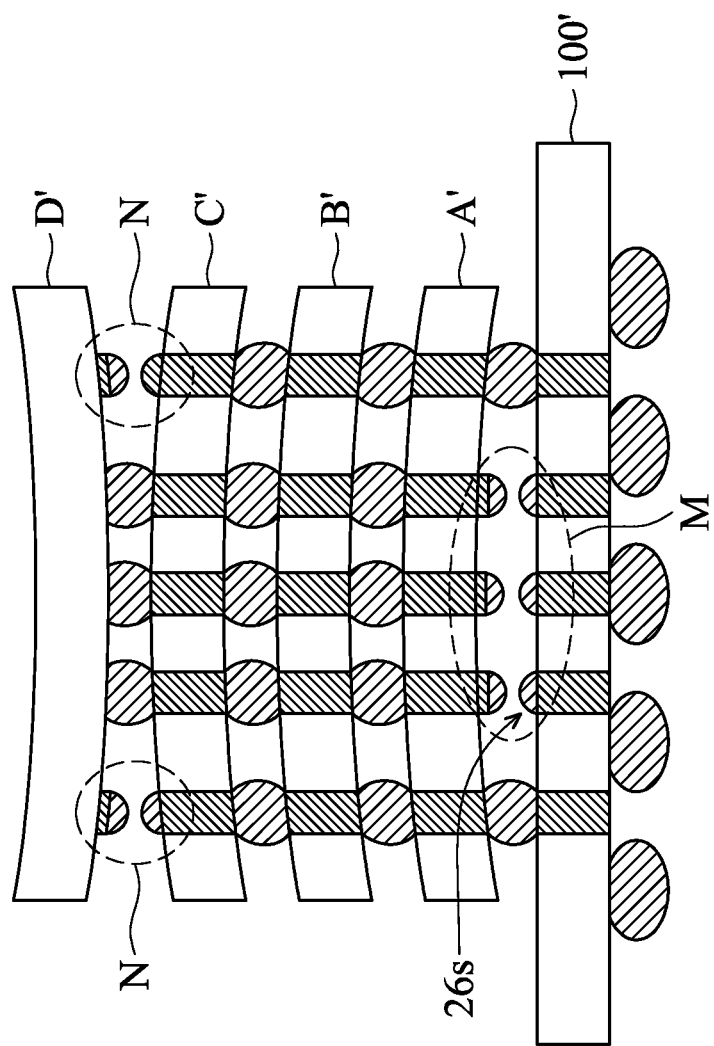
FIG. 4 is a cross-sectional view of dies stacked over a substrate, in accordance with some embodiments.

FIG. 4 is a cross-sectional view of dies A', B', C', and D' stacked over substrate 100' after reflow and at room temperature, in accordance with some embodiments. Dies B' and C' are similar to die A' and also bow downward at the edges. Substrate 100' is similar to substrate 100. In some embodiments, substrate 100' is a wafer and is substantially planar. Due to the bowing of dies A', B', C', and D', bonding structures in region M and regions N are likely to have cold joints (open joints). Region M is near a center of substrate 100'. The center portion of die A' is pulled away from the connectors $26_S$ on substrate 100'. As a result, region M could have open or cracked bonding structures between substrate 100' and die A' after reflow due to bowing of die A'. Regions N are near the edges of dies D' and C'. Due to the upward bowing of die D' and the downward bowing of die C' at edges, the bonding structures between dies D' and C' near regions N are likely to have opens or cracks. Bonding structures with opens or cracks would cause yield reduction.

In order to reduce the effect of bowing, thermal compression bonding process may be used. Thermal compression bonding involves applying external pressure on the stacked dies and substrate during a thermal process. The pressure reduces the effect of bowing. However, the processing is costly and bonding structures near high stress regions, such as regions M and N, still have a risk of cracking. Therefore, finding a mechanism for bonding multiples dies on a substrate that reduces the effect of bowing of dies is desirable.

Figure 5A:
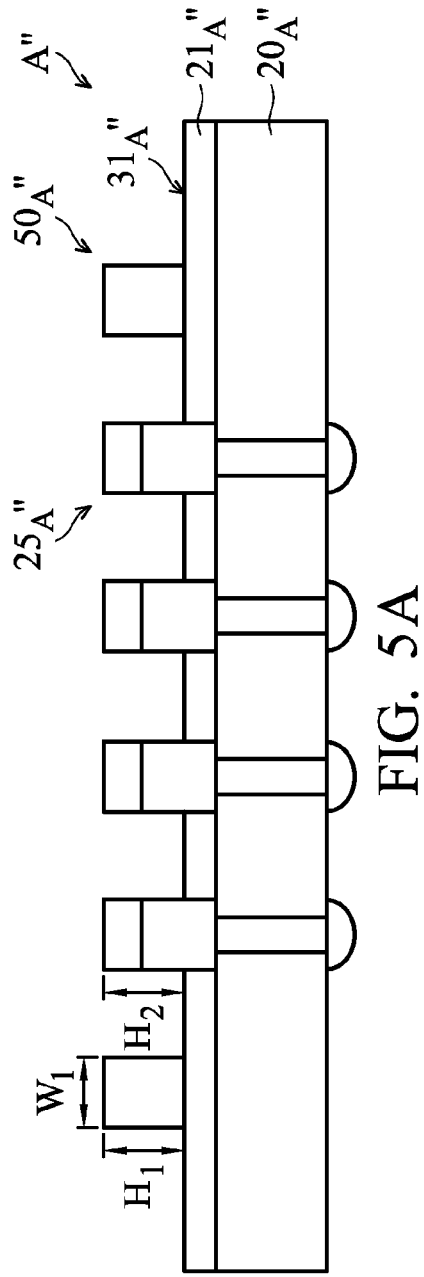
FIG. 5A is a cross-sectional view of a die, in accordance with some embodiments.

FIG. 5A is a cross-sectional view of die A'' with support structures $50_A$'' formed on a side of die A'' with connecting structures $25_A$'', in accordance with some embodiments. The supportive structures $50_A$'' are formed on a surface $31_A$'' of die A'' not occupied by connecting structures $25_A$''. The support structures $50_A$'' are formed next to or near the connecting structures $25_A$''. A height $H_1$ of support structure $50_A$'' is about the same as a height $H_2$ of connecting structures $25_A$'' above surface $31_A$'' (or surface of passivation structure $21_A$''), in some embodiments. In some embodiments, $H_1$ is greater than $H_2$. The support structures $50_A$'' include polymers and adhere to the surface $31_A$'' of passivation structure $21_A$''. In some embodiments, a width $W_1$ of a support structure 50A'' is in a range from about 20 μm to about 500 μm.

In some embodiments, support structures $50_A$'' are made of polymers with fillers, such as silica and/or rubber. The fillers are used to provide (or enhance) strength to the support structures $50_A$'', which are placed between two dies. The examples of polymer(s) used for the support structures $50_A$'' include, but are not limited to, materials such as polyimide, polybenzoxazole (PBO), or benzocyclobutene (BCB). The polymer used for support structures $50_A$'' soften and melt under reflow of bonding structures and adhere to a substrate bonded to die A''. In some embodiments, a glass transition temperature of support structures $50_A$'' is in a range from about 40° C. to about 150° C. After the thermal reflow process with die A'' and substrate 100'' returning to room temperature, the support structures $50_A$'' maintain sufficient strength to maintain the height between die A'' and the substrate. In some embodiments, a Young's modulus of support structures $50_A$'' is in a range from about 1 GPa to about 10 GPa.

Figure 5B:
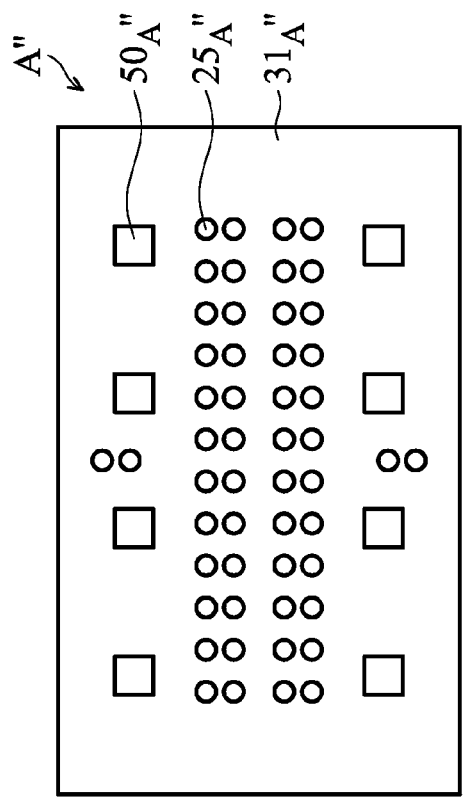
FIG. 5B is a top view of the die of FIG. 5A, in accordance with some embodiments.
Figure 5C:
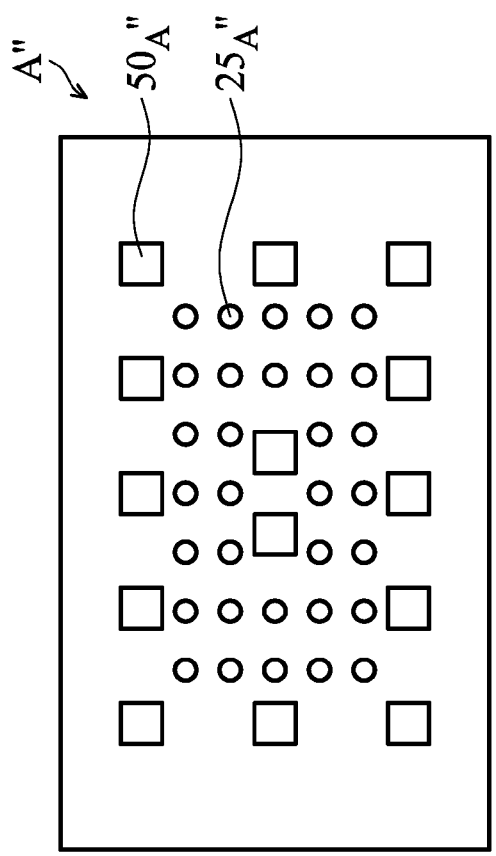
FIG. 5C is a top view of supporting structures and connecting structures on a die, in accordance with some other embodiments.

FIG. 5B is a top view of die A'' with support structures $50_A$'' formed over surface $31_A$'', in accordance with some embodiments. The support structures $50_A$'' are distributed across surface $31_A$'' of die A'' and are formed on surface $31_A$'' not occupied by connecting structures $25_A$''. Since there is limited surface space near the center of die A'', support structures $50_A$'' are arranged mostly surrounding connecting structures $25_A$'' which are congregated near the center of die A''. If the connecting structures are arranged differently, the support structures $50_A$'' are re-arranged accordingly. FIG. 5C is a top view of die A'' with supporting structures $50_A$'' and connecting structures $25_A$'' on surface $31_A$'', in accordance with some embodiments. The connecting structures $25_A$'' are arranged around an outer portion of surface $31_A$''. Some support structures $50_A$'' are placed near the center of die A'' and others are place near outer edges of die A''.

The support structures $50_A$'' are placed at various locations across the surface ($31_A$'') of die A'' to counter the effect of bowing. In some embodiments, the placement of the support structures $50_A$'' is based on the bowing of the two dies or substrates that the support structures are sandwiched between.

Figure 5D:
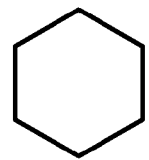
FIG. 5D are top views of various shapes of a support structure, in accordance with some embodiments.
Figure 5D:
Figure 5D:
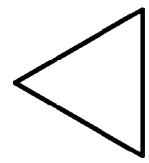
Figure 5D:
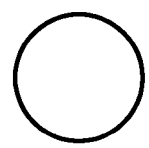
Figure 5D:
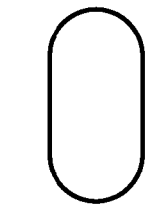

The support structures $50_A$'' in FIGS. 5B and 5C have cross sections in the shapes of squares. However, the support structures $50_A$'' are in other shapes, in some embodiments. FIG. 5D are top views of a support structure $50_A$'' having oval, circle, triangle, rectangle, and hexagon shapes. Other shapes are also possible.

Support structures $50_A$'' may be formed on the surface $31_A$'' of substrate $20_A$'' by various methods. In some embodiments, passivation layer $21_A$'' is over substrate $20_A$'' and support structures $50_A$'' are formed on surface $31_A$'' on top of the passivation layer. For example, structures $50_A$'' may be formed by printing (or screening) with a stencil. During the printing (or screening) process, the support structures $50_A$'' or substrate $20_A$'' are heated to allowed the support structures $50_A$'' to adhere to surface $31_A$'' of substrate $20_A$''.

Alternatively, a layer for material for the support structures $50_A$'' may be deposited on surface $31_A$'' of substrate $20_A$'' prior to forming support structures. After the layer of material is deposited, the layer is than patterned by lithography and etched. Other applicable methods may also be used to form support structures $50_A$''.

Figure 6A:
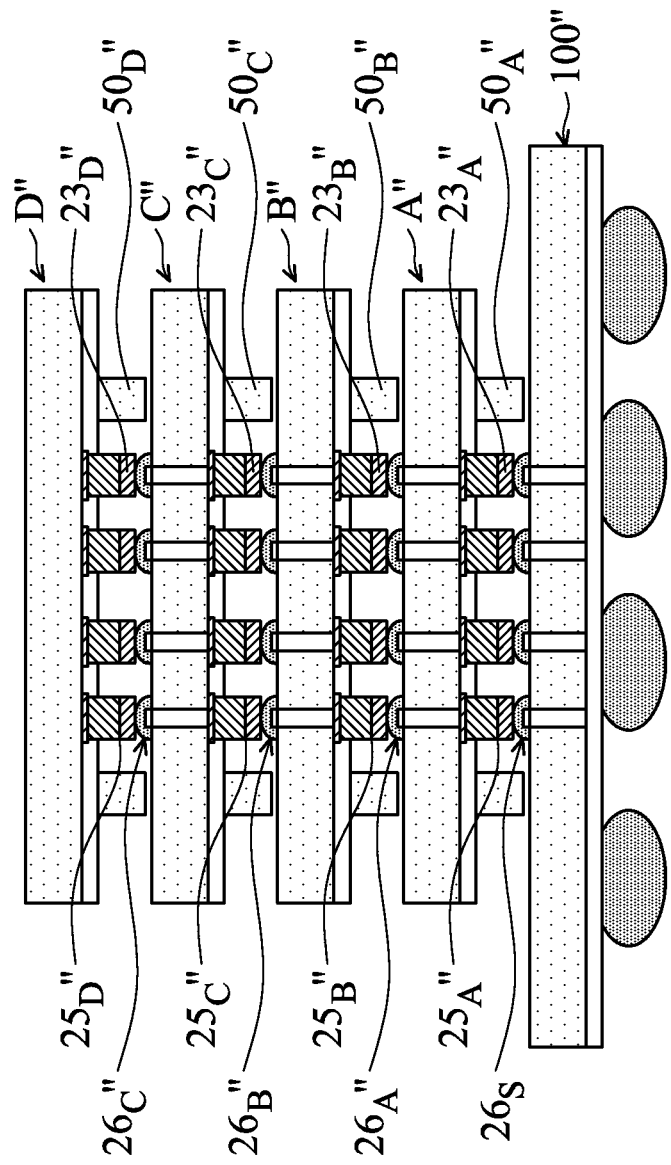
FIG. 6A is cross-sectional view of 3 dies and a substrate for forming a three dimensional integrated circuit (3DIC) structure before a reflow process, in accordance with some embodiments.

FIG. 6A is cross-sectional view of 3 dies and a substrate for forming a three dimensional integrated circuit (3DIC) structure before a reflow process, in accordance with some embodiments. Support structures similar to support structures $50_A$'' may also formed on dies B''', C''', and D'' by similar mechanisms described above. Dies A'', B'', C'', and D'' are similar to dies A', B', C', and D', respectively. After support structures $50_A$'', $50_B$'', $50_C$'', and $50_D$'' are on formed on dies A'', B', C', and D', these dies are stacked on top of each other over substrate 100'', as in FIG. 6A in accordance with some embodiments. The connecting structures $25_A$'' are aligned with and connecting structures $26_S$ of substrate 100''. Support structures $50_A$'' on die A'' are between die A'' and substrate 100''. Similarly, connecting structures $25_B$'' of substrate B'' are aligned connecting structures $26_A$'' on the opposite side of substrate A'' from connecting structures $25_A$''. Support structures $50_B$'' formed on die B'' are between die B'' and die A''.

Similarly, connecting structures $25_C$'' of substrate C'' are aligned with connecting structures $26_B$'' and support structures $50_C$" are between die C" and die B". Connecting structures $25_D$" of substrate D" are aligned with connecting structures $26_C$" and support structures $50_D$" are between die D" and die C".

Figure 6B:
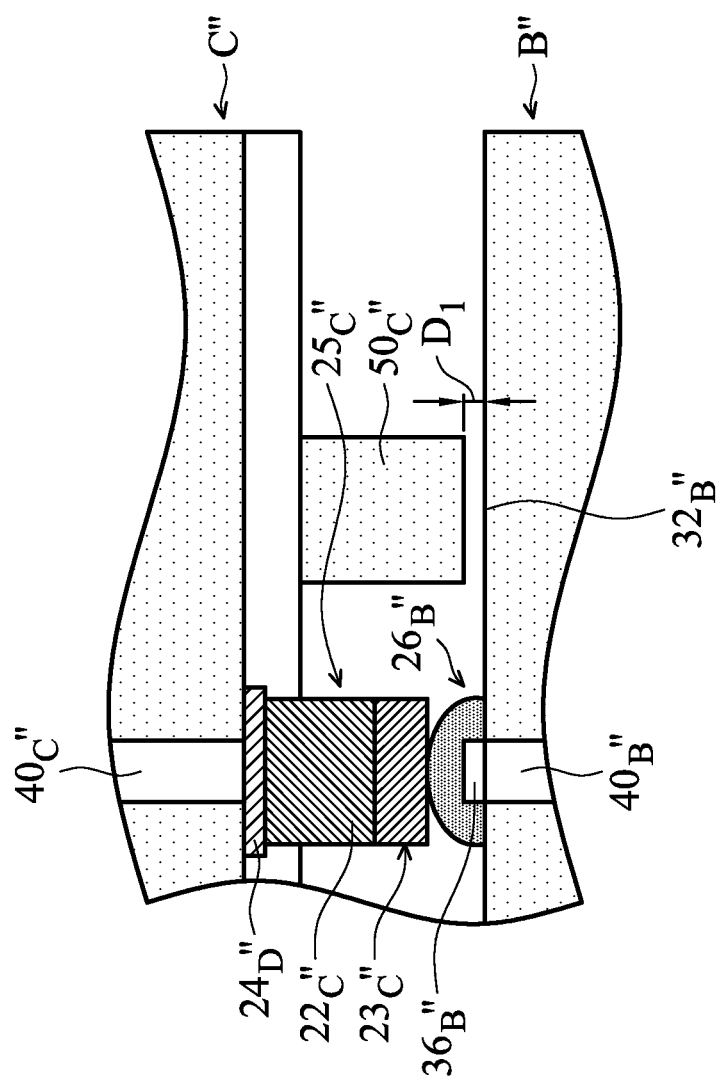
FIG. 6B is a cross-sectional view of a support structure of a die next to a connecting structure aligned with a connecting structure of another die, in accordance with some embodiments.

FIG. 6B is an enlarged cross-sectional view of a support structure $50_C$" on die C" next to a connecting structure $25_C$" aligned with and in contact with a connecting structure $26_B$" of die B", in accordance with some embodiments. FIG. 6B includes a gap with a distance $D_1$ between support structure $50_C$" and a surface $32_B$" of die B". In some embodiments, the support structure $50_C$" touches surface $32_B$". To provide support for the 3DIC with dies A", B", C", D", over substrate 100", the support structure 50C" adheres to surface $32_B$" after reflow. $D_1$ is in a range from about 0 nm to about 2000 nm, in accordance with some embodiments. $D_1$ can be greater than zero, because solder layer $23_C$" of die C" softens and melts to cover at least a portion of connecting structure $26_B$". In some embodiments, connecting structure $26_B$" is formed over a metal pad $36_B$". Due to the softening and melting of solder layer $23_C$", a height of solder layer $23_C$" between copper post $22_C$" and connecting structure $26_B$" is shortened from a pre-reflow height, which allows support structure $50_C$" to touch surface $32_B$" and become adhered to surface $32_B$".

Figure 7A:
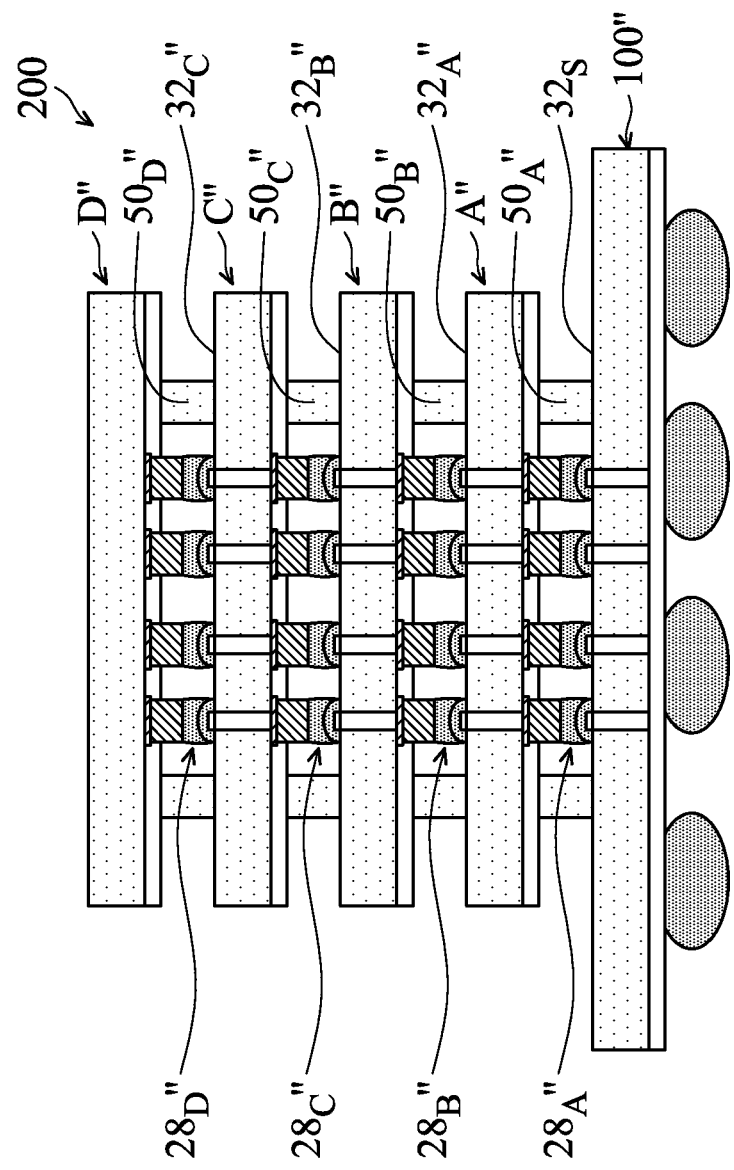
FIG. 7A is a cross-sectional view of a 3DIC structure, in accordance with some embodiments.

FIG. 7A is a cross-sectional view of a 3DIC structure, in accordance with some embodiments. After dies A", B", C" and D" are stacked over substrate 100", the stacked structure undergoes a reflow process. The reflow process enables the solder layers $23_A$", $23_B$", $23_C$" and $23_D$" to bond to connecting structure $26_S$, $26_A$", $26_B$", and $26_C$" respectively to form bonding structures $28_A$", $28_B$", $28_C$" and $28_D$", as in FIG. 7A, in accordance with some embodiments. The bonded dies A", B", C", D" and substrate 100' form a 3DIC structure 200". The reflow process also bonds support structures $50_D$" to the back surface $32_C$" of die C", support structures $50_C$" to the back surface $32_B$" of die B", support structures $50_B$" to the back surface $32_A$" of die A", and support structures $50_A$" to the back surface $32_S$ of substrate 100".

The reflow process is conducted at a peak temperature in a range from about 230° C. to about 250° C., in accordance with some embodiments. For example under the reflow process, the polymer material of the support structures $50_D$" softens and adheres to surface $32_C$". One end of each of support structures $50_D$" adheres to surface $31_C$" of die D" and the other end of the same support structure $50_D$" adheres to surface $32_C$" of die C". As mentioned above, the support structures $50_D$" include fillers used to increase strength of the support structures. Heights of the support structures $50_D$" are maintained during the reflow process to keep the distance between dies D" and C".

Figure 7B:
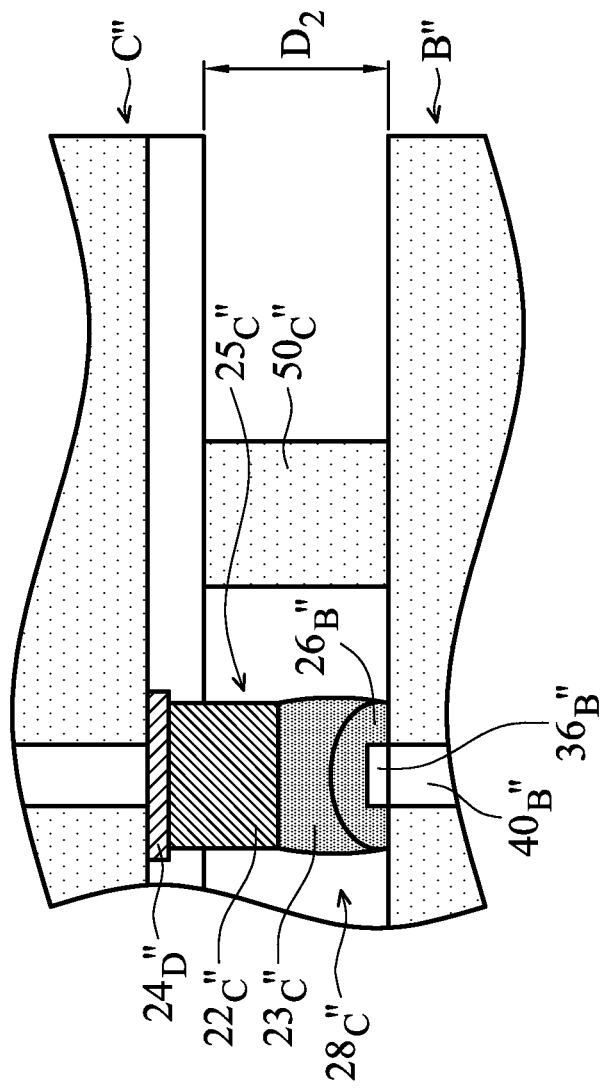
FIG. 7B is a cross-sectional view of a support structure next to a bonding structure between on two dies, in accordance with some embodiments.

FIG. 7B is an enlarged cross-sectional view of a support structure $50_C$" next to a bonding structure $28_C$" between on dies C" and B", in accordance with some embodiments. A height $D_2$ of support structures $50_C$" is in a range from about 10 μm to about 50 μm.

The support structures $50_C$" also relieve stress exerted on bonding structures $28_C$" between dies C" and B" and reduces the risk of cracking of bonding structures. The Young's Modulus of the support structures $50_C$" helps to relieve stress exerted on bonding structures $28_C$" by absorbing forces associated with bowing of dies B" and C" during formation of the dies. As a result, support structures $50_C$" improve the yield of the 3DIC structure 200" of bonded dies A", B", C", D" and substrate 100", in comparison with a 3DIC which does not include support structures $50_C$". Support structures $50_D$", $50_B$" and $50_A$" provide similar function as structures $50_C$".

Figure 8:
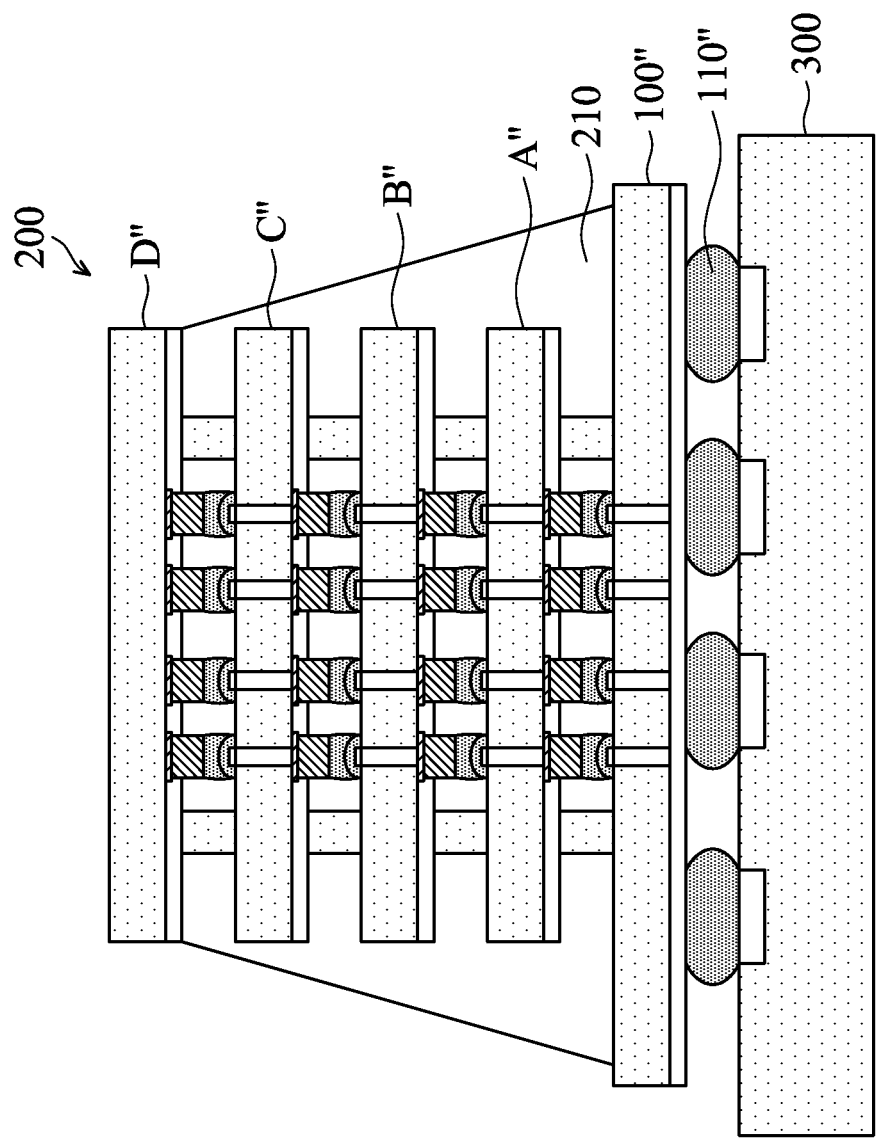
FIG. 8 is a cross-sectional view of a 3DIC structure, in accordance with some embodiments.

FIG. 8 is a cross-sectional view of a 3DIC structure, in accordance with some embodiments. After the 3DIC structure 200" has been formed, an underfill 210 can be applied on the surface of substrate 100" to fill the space between substrate 100" and dies A", B", C", and D", as in FIG. 8 in accordance with some embodiments. The 3DIC structure 200" with the underfill is bonded to another substrate 300 via external connectors 110", as in FIG. 8.

Substrate 300 may be made of a semiconductor wafer, or a portion of wafer. In some embodiments, substrate 100 includes silicon, gallium arsenide, silicon on insulator ("SOI") or other similar materials. In some embodiments, substrate 300 also includes passive devices such as resistors, capacitors, inductors and the like, or active devices such as transistors. In some embodiments, substrate 300 includes additional integrated circuits. In addition, the substrate 300 may be made of other materials. For example, in some embodiments, substrate 300 is a multiple-layer circuit board. In some embodiments, substrate 300 also includes bismaleimide triazine (BT) resin, FR-4 (a composite material composed of woven fiberglass cloth with an epoxy resin binder that is flame resistant), ceramic, glass, plastic, tape, film, or other supporting materials that may carry the conductive pads or lands needed to receive conductive terminals.

In 3DIC structure, such as structure 200", the numbers of support structures between different dies and/or between a die and a substrate could be the same or different. The layouts and designs of the support structures are based on the shapes and severity of bowing of the dies and substrate(s). The bowing shapes of dies A, B, C, and D described above are merely examples. Support structures $50_A$", $50_B$", $50_C$", and $50_D$" described above may be used to relieve stress and to help maintaining height between two neighboring dies with different bowing shapes from those described above.

The embodiments described above provide methods and structures for forming support structures between dies and substrate(s) of a 3DIC structures. Each support structure adheres to surfaces of two neighboring dies or die and substrate to relieve stress caused by bowing of the die(s) and/or substrate on the bonding structures formed between the dies or die and substrate. A cost of the support structures is much lower than other processes, such as thermal compression bonding, to reduce the effect of bowing of dies and substrates on 3DIC formation. The support structures improves yield of 3DIC structures.

In some embodiments, a three dimensional integrated circuit (3DIC) structure is provided. The 3DIC includes a first semiconductor die, and a second semiconductor die. The second semiconductor die is bonded to the first semiconductor die with bonding structures. The 3DIC also includes a first plurality of support structures disposed between and adhered to a first surface of the first semiconductor die and a second surface of the second semiconductor die. Each support structure of the first plurality of support structures comprises a polymer having at least one filler.

In some other embodiments, a three dimensional integrated circuit (3DIC) structure is provided. The 3DIC structure includes a first semiconductor die, and a second semiconductor die. The second semiconductor die is bonded to the first semiconductor die with bonding structures. The 3DIC also includes a first plurality of support structures disposed between and adhered to a first surface of the first semiconductor die and a second surface of the second semiconductor die. Each support structure of the first plurality of support structures comprises a polymer having at least one filler. The 3DIC further includes a substrate wider than the first semiconductor die and the second semiconductor die, and the second semiconductor die is bonded to the substrate. In addition, a second plurality of support structures is disposed between and adhered to a third surface of the second semiconductor die and a fourth surface of the substrate, wherein each support structure of the second plurality of support structures comprises the polymer having the at least one filler.

In yet some other embodiments, a method of forming a 3DIC structure is provided. The method includes aligning a first connecting structure of a first semiconductor die with a second connecting structure of a second semiconductor die. The first semiconductor die has a first connecting structure and a support structure formed over a first surface of the first semiconductor die. The support structure is next to the first connecting structure. The second semiconductor die has a second connecting structure on a second surface of the second semiconductor die. In addition, the method includes performing a reflow to form a bonding structure from the first connecting structure of the first semiconductor die and the second connecting structure of the second semiconductor die. The reflow process also bonds the support structure to the second surface of the second semiconductor die.

Various modifications, changes, and variations apparent to those of skill in the art may be made in the arrangement, operation, and details of the methods and systems disclosed. Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

The invention claimed is:

1. A three dimensional integrated circuit (3DIC) structure, comprising:
   a first semiconductor die;
   a second semiconductor die, wherein the second semiconductor die is bonded to the first semiconductor die with bonding structures that contact through-substrate-vias (TSVs) extending through the second semiconductor die at a first interface between the bonding structures and the TSV;
   a first plurality of support structures disposed between a first surface of the first semiconductor die and a second surface of the second semiconductor die, wherein the first plurality of support structures are made of polymers with fillers to provide strength to the first plurality of support structures, and wherein the polymers are laterally spaced apart from a closest one of the bonding structures; and
   wherein the first plurality of support structures contact the second semiconductor die at a second interface that is co-planar with the first interface.

2. The 3DIC structure of claim 1, wherein each of the first plurality of support structures is next to at least one of the bonding structures.

3. The 3DIC structure of claim 1, wherein a portion of the first plurality of support structures are disposed at a center region between the first semiconductor die and the second semiconductor die and another portion of the first plurality of support structures are disposed at an edge region between the first semiconductor die and the second semiconductor die.

4. The 3DIC structure of claim 1, wherein the first plurality of the support structures have cross-sections in shapes of square, circle, triangle, rectangle, hexagon, oval, or a combination thereof.

5. The 3DIC structure of claim 1, further comprising:
   a passivation layer arranged onto the first surface of the first semiconductor die;
   a copper post protruding outward through an outer surface of the passivation layer facing away from the first semiconductor die;
   a metal pad arranged onto the second surface; and
   a solder layer arranged vertically between the copper post and the metal pad and laterally offset from the first plurality of support structures.

6. The 3DIC structure of claim 1, further comprising:
   a substrate wider than the first semiconductor die and the second semiconductor die, wherein the second semiconductor die is bonded to the substrate; and
   a second plurality of support structures disposed between and adhere to a third surface of the second semiconductor die and a fourth surface of the substrate, wherein the second plurality of support structures are made of a material similar to the first plurality of support structures.

7. The 3DIC of claim 1, wherein an underfill filing space between the first semiconductor die and the second semiconductor die.

8. The 3DIC of claim 1, wherein the polymers of the first plurality of support structures are made of polyimide, polybenzoxazole (PBO), or benzocyclobutene (BCB).

9. The 3DIC of claim 1, wherein the fillers of the first plurality of support structures include silica, rubber, or a combination thereof.

10. A three dimensional integrated circuit (3DIC) structure, comprising:
    a first semiconductor die;
    a second semiconductor die, wherein the second semiconductor die is bonded to the first semiconductor die with a plurality of bonding structures;
    a passivation layer arranged onto a first surface of the first semiconductor die, wherein the plurality of bonding structures have linear sidewalls that extend from above a surface of the passivation layer facing away from the first semiconductor die to below the surface; and
    a first plurality of support structures disposed between a first surface of the first semiconductor die and the second semiconductor die, wherein the first plurality of support structures are made of polymers that are separated from the first surface by the passivation layer.

11. A method of forming a 3DIC structure, comprising:
    providing a first semiconductor die, wherein the first semiconductor die has a first connecting structure and a support structure made of a polymer, which are formed over a first surface of the first semiconductor die, wherein the support structure is next to the first connecting structure;
    providing a second semiconductor die, wherein the second semiconductor die has a second connecting structure on a second surface of the second semiconductor die;
    aligning the first connecting structure of the first semiconductor die with the second connecting structure of the second semiconductor die;
    bringing the first connecting structure into contact with the second connecting structure at an interface located along a horizontal line extending laterally through the support structure; and performing a reflow to form a bonding structure from the first connecting structure of the first semiconductor die and the second connecting structure of the second semiconductor die, wherein the support structure is configured to connect the first semiconductor die to the second semiconductor die during the reflow to prevent warpage of the first semiconductor die away from the second semiconductor die.

12. The method of claim 11, further comprising;
forming the support structure on the first surface of the first semiconductor die, wherein the support structure does not laterally abut a connecting structure between the first semiconductor die and the second semiconductor die.

13. The method of claim 12, wherein the forming the support structure is performed by printing with stencil under a thermal condition or by patterning a deposited layer.

14. The method of claim 11, wherein the support structure is made of a polymer with fillers.

15. The method of claim 14, wherein the polymer is made of polyimide, polybenzoxazole (PBO), or benzocyclobutene (BCB), and the fillers include silica, rubber, or a combination thereof.

16. The method of claim 12, wherein the support structure is shorter than the first connecting structure.

17. The 3DIC structure of claim 10,
wherein the plurality of bonding structures respectively comprise a solder layer that contacts the second semiconductor die, and that has a curved outermost sidewall facing one of the first plurality of support structures; and
wherein the solder layer covers a to surface and sidewalls of a metal pad arranged over the second semiconductor die.

18. The method of claim 11,
wherein the reflow causes a solder layer of the bonding structure to have a curved outermost sidewall contact the second surface and facing the support structure; and
wherein the solder layer covers a to surface and sidewalls of a metal pad arranged over the second surface of the second semiconductor die.

19. The 3DIC of claim 1, wherein the first plurality of support structures are separated from the second surface of the second semiconductor die by a non-zero space.

20. The 3DIC of claim 1, wherein the bonding structures comprise a solder layer contacting the second surface of the second semiconductor die, and covering a top surface and sidewalls of a metal pad arranged over the second surface of the second semiconductor die.

* * * * *